(12) United States Patent
Xiaochun

(10) Patent No.: US 8,288,200 B2
(45) Date of Patent: Oct. 16, 2012

(54) SEMICONDUCTOR DEVICES WITH CONDUCTIVE CLIPS

(75) Inventor: Tan Xiaochun, Shanghai (CN)

(73) Assignee: Diodes Inc., Plano, TX (US)

( * ) Notice: Subject to any disclaimer, the term of this patent is extended or adjusted under 35 U.S.C. 154(b) by 44 days.

(21) Appl. No.: 11/291,652

(22) Filed: Nov. 30, 2005

(65) Prior Publication Data
US 2007/0123073 A1 May 31, 2007

(51) Int. Cl.
*H01L 21/00* (2006.01)

(52) U.S. Cl. .......... 438/106; 438/26; 438/113; 438/114; 438/119; 257/E21.001

(58) Field of Classification Search .................. 438/113, 438/114; 257/E21.001
See application file for complete search history.

(56) References Cited

U.S. PATENT DOCUMENTS

| | | | |
|---|---|---|---|
| 4,803,545 A | 2/1989 | Birkle | |
| 4,935,803 A * | 6/1990 | Kalfus et al. | 257/673 |
| 5,103,289 A * | 4/1992 | Brady | 257/692 |
| 5,225,897 A | 7/1993 | Reifel et al. | 257/787 |
| 5,343,072 A * | 8/1994 | Imai et al. | 257/666 |
| 5,350,713 A | 9/1994 | Liang | |
| 5,821,611 A * | 10/1998 | Kubota et al. | 257/673 |
| 5,834,842 A | 11/1998 | Majumdar et al. | |
| 6,005,287 A * | 12/1999 | Kaiya et al. | 257/674 |
| 6,307,253 B1* | 10/2001 | Yamamoto et al. | 257/666 |
| 6,307,755 B1* | 10/2001 | Williams et al. | 361/813 |
| 6,351,034 B1 | 2/2002 | Farnworth et al. | |
| 6,396,127 B1 | 5/2002 | Munoz et al. | |
| 6,587,344 B1 | 7/2003 | Ross | |
| 6,608,373 B2 | 8/2003 | Wu et al. | |
| 6,650,004 B1* | 11/2003 | Horie et al. | 257/666 |
| 6,762,067 B1* | 7/2004 | Quinones et al. | 438/11 |
| 6,774,466 B1* | 8/2004 | Kajiwara et al. | 257/673 |
| 6,867,072 B1* | 3/2005 | Shiu et al. | 438/123 |
| 6,897,567 B2* | 5/2005 | Horie | 257/779 |

* cited by examiner

*Primary Examiner* — Angel Roman
(74) *Attorney, Agent, or Firm* — Courtney IP Law; Barbara B. Courtney

(57) ABSTRACT

A semiconductor device is described that includes a die connected between a conductive platform and a conductive clip. The semiconductor device is formed by a process that includes mounting a first surface of each of multiple die to each of a number of conductive mounting platforms of a lead frame structure. The process also mounts a clip structure to the lead frame structure, the clip structure including a number of conductive clips. Mounting of the clip structure to the lead frame structure includes aligning each of the conductive clips with corresponding ones of the conductive mounting platforms so that a portion of each of the conductive clips contacts a second surface of a corresponding die.

13 Claims, 6 Drawing Sheets

SEMICONDUCTOR DEVICES WITH CONDUCTIVE CLIPS

TECHNICAL FIELD

The present embodiments relate generally to the field of semiconductor devices and, more particularly, to a clip attaching process for use in semiconductor devices.

BACKGROUND

Rapid growth in the electrical industry has produced a need for electrical devices that are smaller in size but that operate in high-power architectures to support multiple features/functions. A high-power device generally supports high current and produces very high-power, which requires the device to have efficient heat dissipation capability. Typical two-terminal surface-mount discrete power semiconductor devices consist of a lead frame on which the cathode/bottom side of a semiconductor die or chip is mounted, and a clip that connects to the anode/top side of a semiconductor die. Manufacturers have started using conductive clips for high-power devices instead of gold wire or aluminum wire to connect the thin layer of metal on the top of die to the leads of the lead frame.

The clip attaching process for attaching the conductive clips to components of the device typically include cutting the clip from a clip reel, picking up the clip from the clip reel, and attaching the clip to the die surface. Use of conducting clips however introduces issues like clip movement that have increased the difficulty and cost of manufacturing the semiconductor package and reduced the units per hour ("UPH") rate in assembly. Consequently, there is a need for a semiconductor device process that includes a new clip attaching process that solves these issues while allowing for quick attachment of the clip on the die surface to connect the thin layer of metal on the top of die surface to the lead of substrate.

DETAILED DESCRIPTION

A semiconductor device or "device" is provided that includes a conductive mounting platform, a semiconductor die, and a conductive clip. The clip attaching process for attaching one or more conductive clips to components of the device allows for quick attachment of the clip(s) on the die surface to connect the thin layer of metal on the top of die surface to the lead of substrate, and provides a device suitable for high-power applications. The device formation process of an embodiment generally includes forming a lead frame structure that includes multiple conductive mounting platforms used as bottom heat slugs, mounting solder on one or more portions of each conductive mounting platform, mounting a first surface of a semiconductor die on the solder surface, mounting solder to a second surface of the die, mounting the clip structure to the lead frame structure, wherein this mounting forms an electrical connection between a portion of the surface of each conductive clip and the die.

The following description provides specific details for a thorough understanding of, and enabling description for, embodiments of a semiconductor device and device formation process. However, one skilled in the art will understand that the device and process described herein may be practiced without these details. In other instances, well-known structures and functions have not been shown or described in detail to avoid unnecessarily obscuring the description of the embodiments described herein.

A semiconductor device is described that includes a die connected between a conductive platform and a conductive clip. The semiconductor device is formed by a process that includes mounting a first surface of each of multiple die to each of a number of conductive mounting platforms of a lead frame structure. The process also mounts a clip structure to the lead frame structure, the clip structure including a number of conductive clips. Mounting of the clip structure to the lead frame structure includes aligning each of the conductive clips with corresponding ones of the conductive mounting platforms so that a portion of each of the conductive clips contacts a second surface of a corresponding die.

Figure 1:
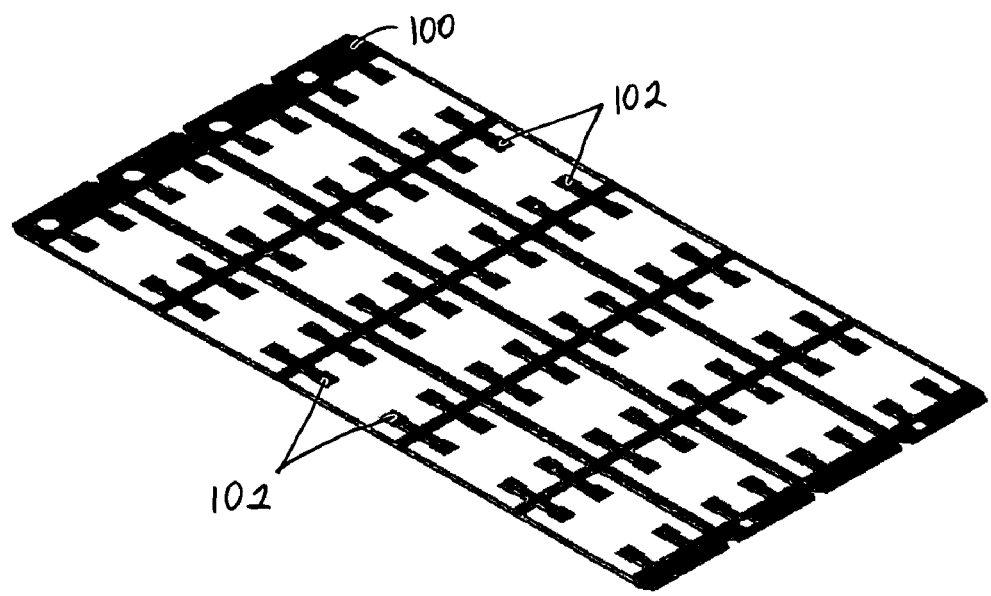
FIG. 1 is a lead frame structure, under an embodiment.
Figure 2:
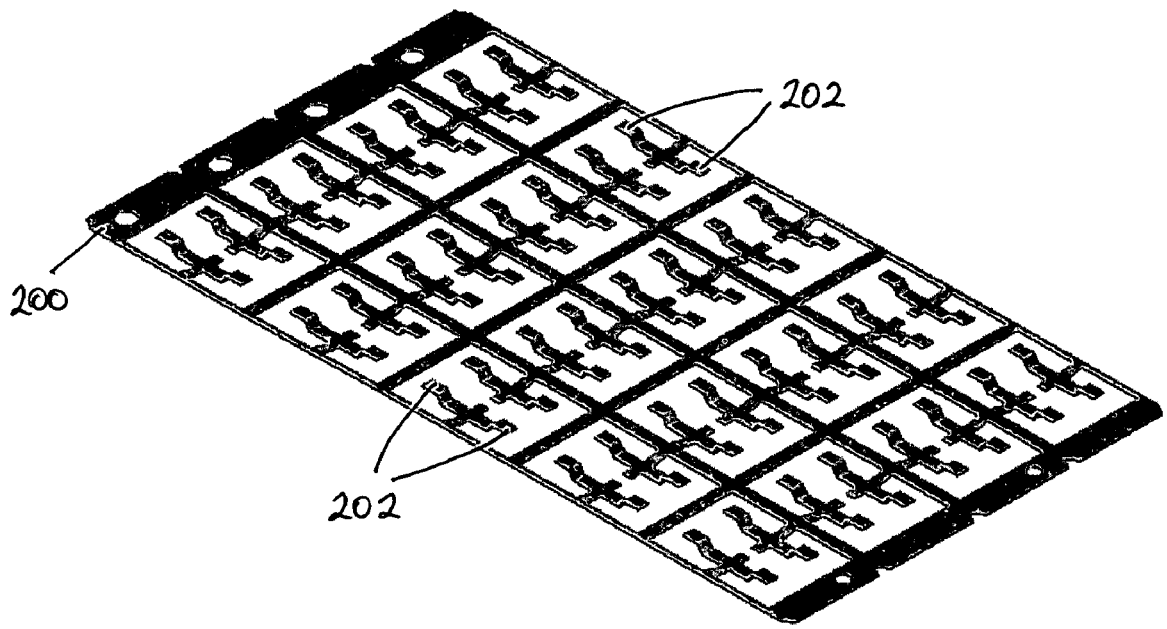
FIG. 2 is a clip structure, under an embodiment.

FIG. 1 is a lead frame structure 100, under an embodiment. The lead frame structure 100 includes numerous conductive mounting platforms 102, each of which is used in formation of a device. FIG. 2 is a clip structure 200, under an embodiment. The clip structure 200 includes numerous conductive clips 202, each of which is used in formation of a device.

Figure 3:
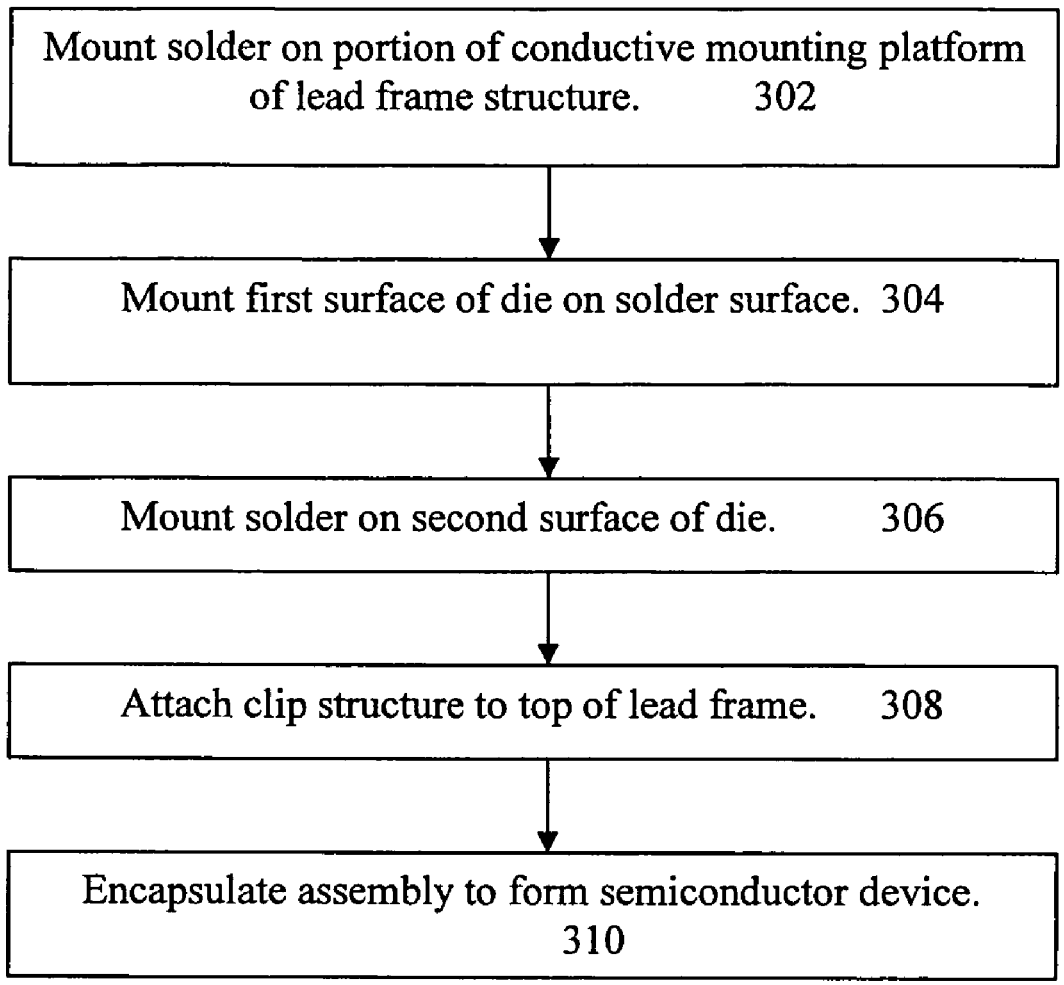
FIG. 3 is a flow diagram for forming a semiconductor device using the lead frame structure and clip structure, under an embodiment.

FIG. 3 is a flow diagram for forming 300 a semiconductor device using the lead frame structure 100 and clip structure 200, under an embodiment. Semiconductor device formation includes forming the lead frame structure 100, which includes multiple conductive mounting platforms 102 that are used as bottom heat slugs in the semiconductor assemblies of an embodiment. Semiconductor device formation also includes forming the clip structure 200, which includes multiple conductive clips 202 each of which are used in the semiconductor assemblies of an embodiment.

Figure 4:
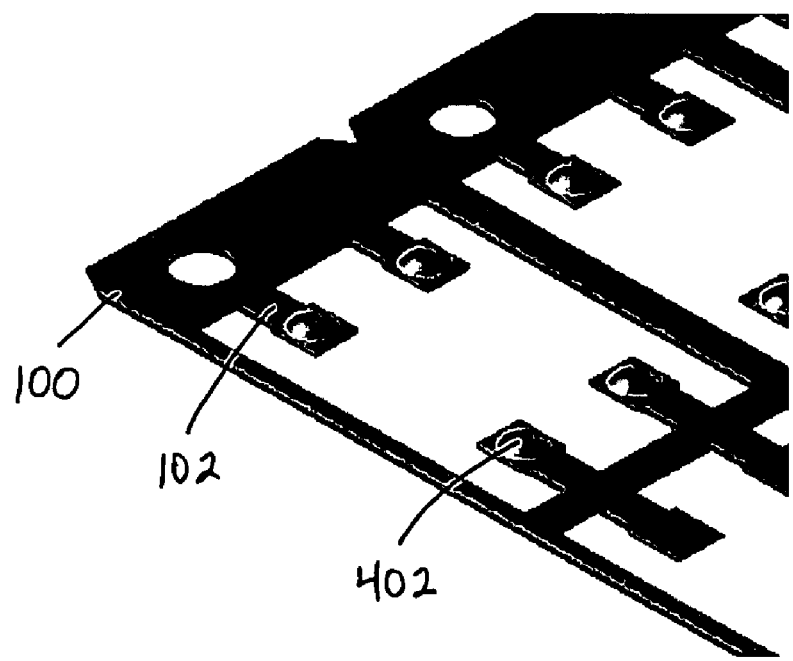
FIG. 4 shows solder after mounting on a portion of the conductive mounting platform of the lead frame structure, under an embodiment.

The semiconductor device formation 300 includes mounting or applying 302 solder on one or more portions of each conductive mounting platform in preparation for die attachment. FIG. 4 shows solder 402 after mounting on a portion of the conductive mounting platform 102 of the lead frame structure 100, under an embodiment.

Figure 5:
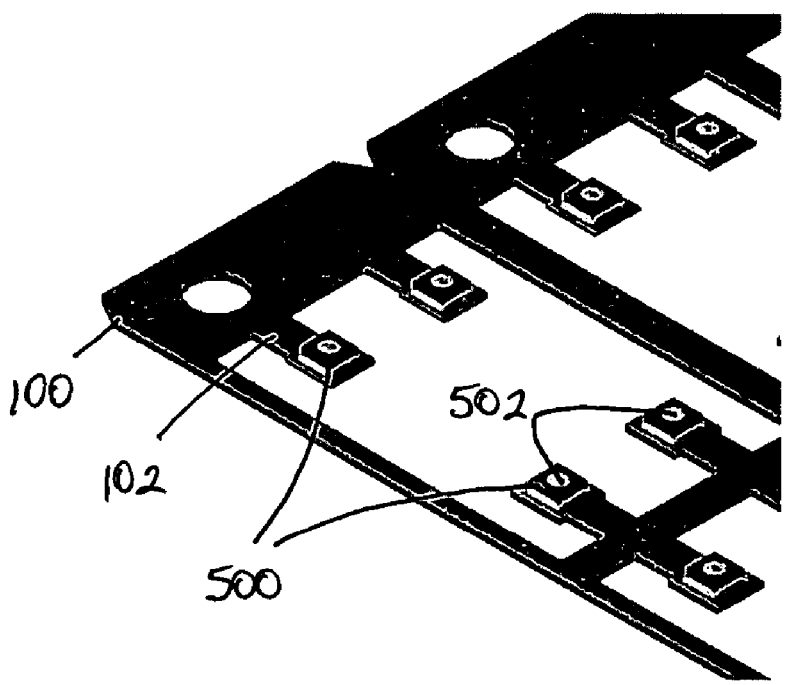
FIG. 5 is a semiconductor die mounted or attached to the solder, under an embodiment.

The semiconductor device formation 300 further includes mounting 304 a first surface of a semiconductor die on the solder surface. The first surface of an embodiment is a bottom surface of the die, but the embodiment is not so limited. The bottom surface may be either of an anode or cathode of the die as appropriate to the device and the configuration of the top surface of the die. FIG. 5 is a semiconductor die 500 mounted or attached to the solder 402, under an embodiment.

The semiconductor device formation 300 further includes mounting or applying 306 solder to a second surface of the die. The second surface of an embodiment is a top surface of the die, but the embodiment is not so limited. The top surface may be either of an anode or cathode of the die as appropriate to the device and the configuration of the bottom surface of the die. FIG. 5 shows solder 502 after mounting on a second surface of the die 500, under an embodiment. While the device formation processes of an embodiment use solder 402 and 502 to join the die to the other components of the device, alternative embodiments may use other compounds to join the die to the other components of the device as appropriate to the process and/or device.

Figure 6:
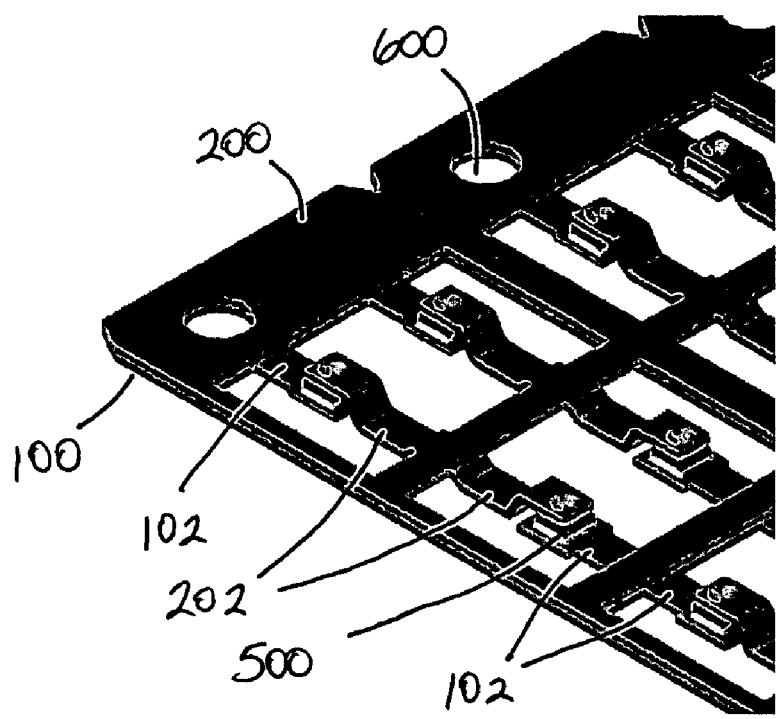
FIG. 6 is a clip structure attached to a lead frame structure, under an embodiment.

The semiconductor device formation 300 further includes mounting or attaching 308 the clip structure 200 to the lead frame structure. FIG. 6 is a clip structure 200 attached to a lead frame structure 100, under an embodiment. The mounting or attaching 308 of the clip structure 200 to the lead frame structure 100 of an embodiment uses a fiducial hole 600 to properly align the conductive clips 202 of the clip structure 200 with the die surface. The mounting 308 of alternative embodiments may use other references, standards, structures, and/or marks on one or more of the lead frame structure 100, conductive mounting platform(s) 102, clip structure 200, conductive clip(s) 202, and die 500 to properly position or align the conductive clips 202 with the die surface. This mounting 308 forms an electrical connection between a portion of the surface of each conductive clip and the solder 502 of the corresponding conductive mounting platform. Consequently, the combination of the conductive mounting platform 102, the die 500, and the conductive clip 202, along with the solder 402 and 502, forms an electrically conductive path between the die 500 and each of the conductive mounting platform 102 and the conductive clip 202, but the embodiment is not so limited.

Figure 7:
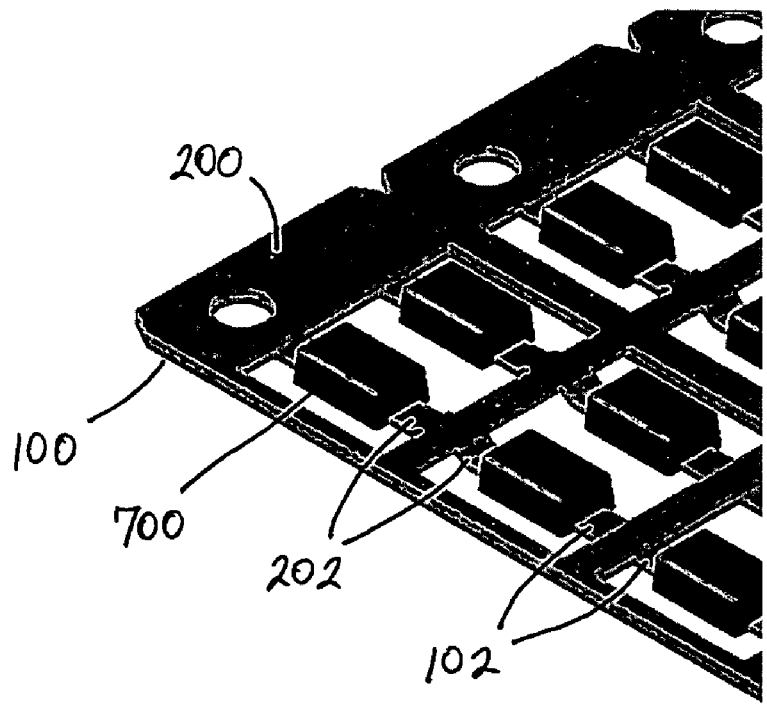
FIG. 7 is an encapsulated semiconductor device attached to the lead frame and clip structures, under an embodiment.

The semiconductor device formation 300 further includes forming 310 a packaging enclosure around the components of the semiconductor device. Forming the enclosure includes encapsulating or encasing the conductive mounting platform 102, solder 402, die 500, solder 502, and portions of the conductive clip 202 corresponding to the semiconductor device in an epoxy or other suitable compound as appropriate to the device and using processes as appropriate to the device. FIG. 7 is an encapsulated semiconductor device 700 attached to the lead frame and clip structures, under an embodiment. Following formation of the packaging enclosure 700, the device is separated from each of the lead frame structures 100 and clip structures 200.

Figure 8:
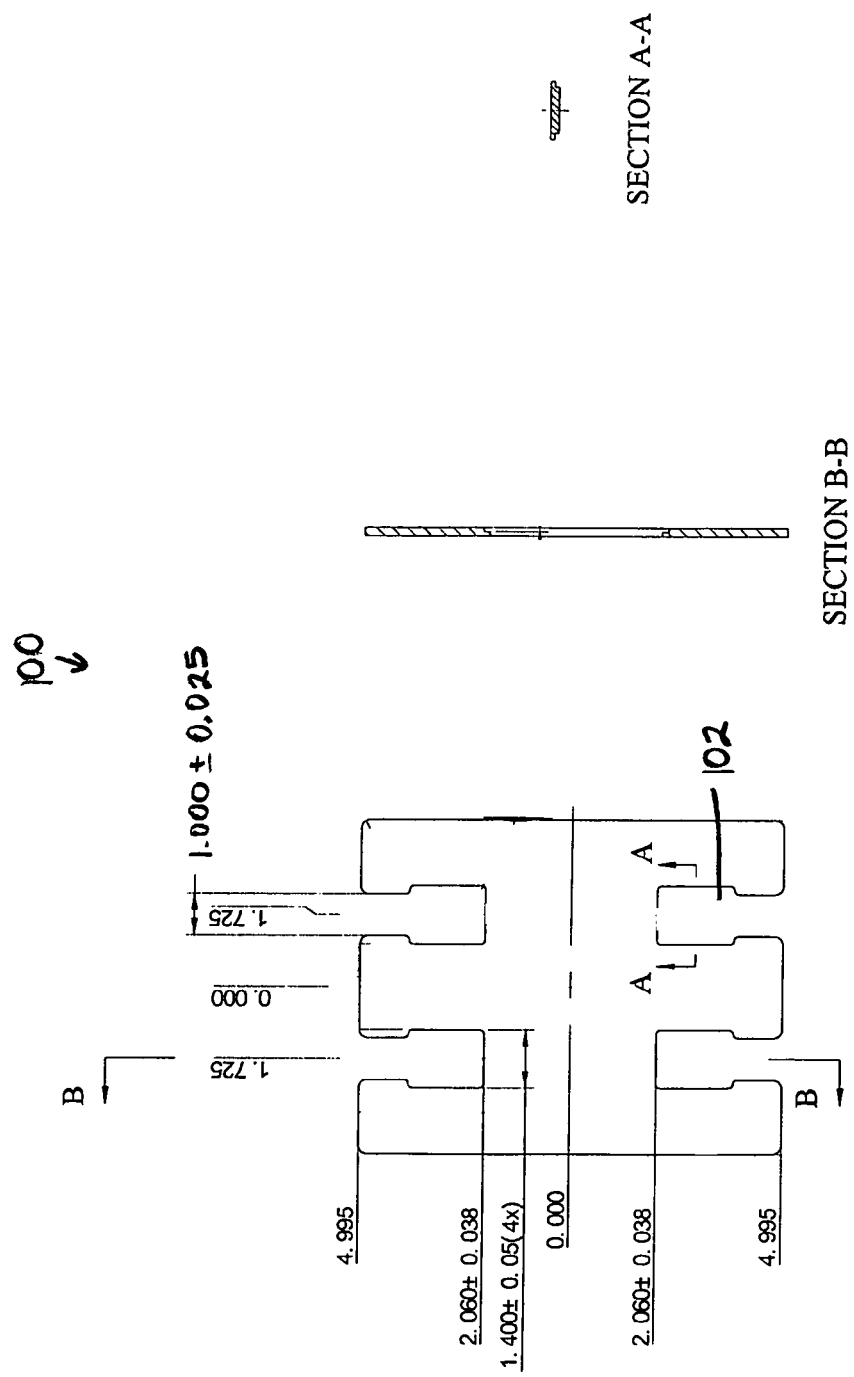
FIG. 8 is a schematic of a portion of a lead frame structure including a number of conductive mounting platforms, under an embodiment.
Figure 9:
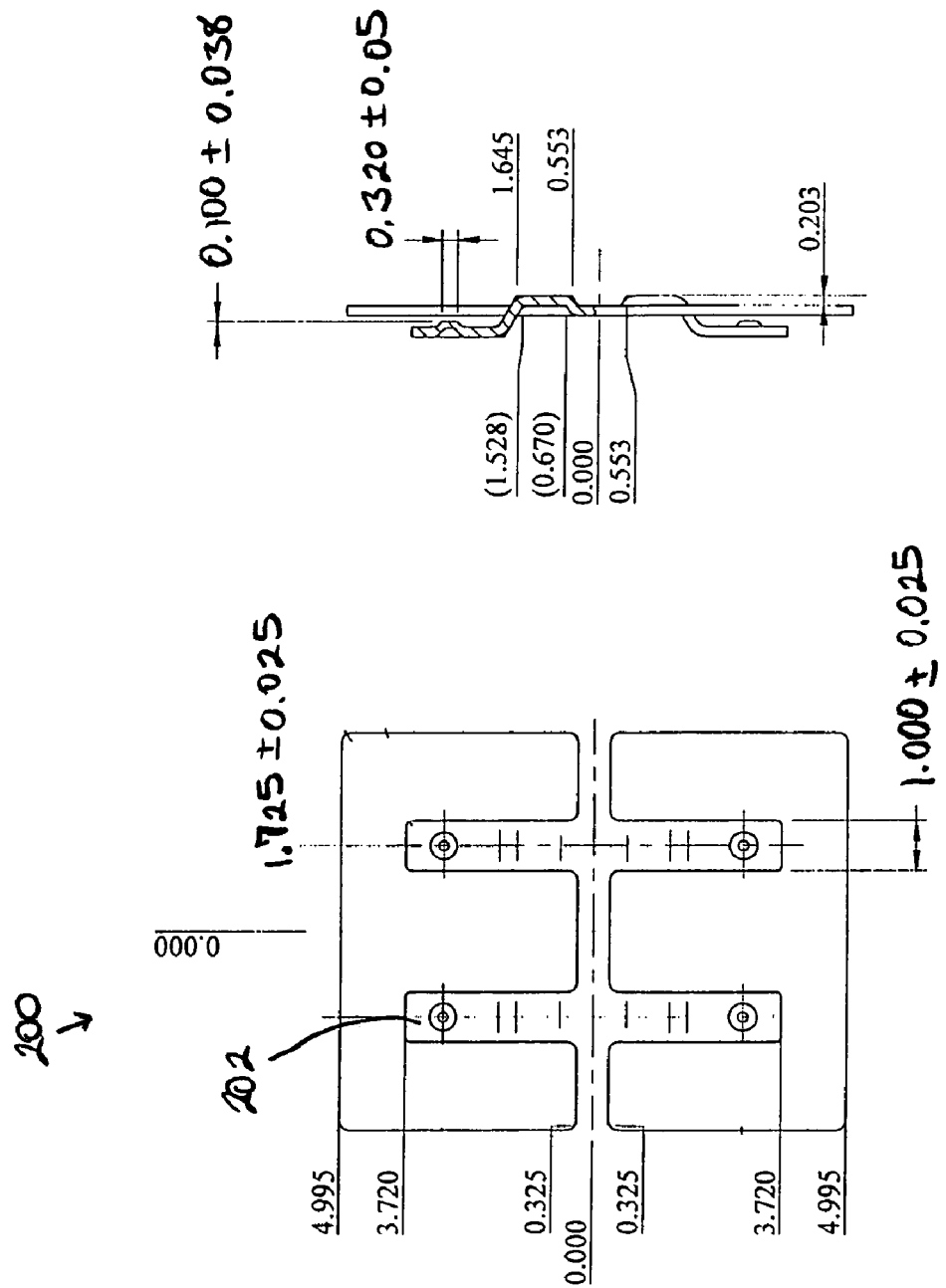
FIG. 9 is a schematic of a portion of a clip structure including a number of conductive clips, under an embodiment.

FIG. 8 is a schematic of a portion of a lead frame structure 100 including a number of conductive mounting platforms 102, under an embodiment. FIG. 9 is a schematic of a portion of a clip structure 200 including a number of conductive clips 202, under an embodiment. These schematics of the lead frame structure 100 and clip structure 200 includes dimensions (e.g., millimeters) of an example embodiment, however these dimensions do not limit the lead frame structure 100 and the clip structure 200 to these exact dimensions as alternative embodiments can use different dimensions as appropriate to a specific semiconductor package design.

Aspects of the semiconductor device and process described above can be used in any of a variety of electronic components. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above descriptions are not intended to be exhaustive or to limit the disclosed embodiments to the precise forms disclosed. While specific embodiments of, and examples for, the semiconductor device and process are described herein for illustrative purposes, various equivalent modifications are possible within the scope of the description, as those skilled in the relevant art will recognize. The teachings provided herein can be applied to other manufacturing systems, not only for the semiconductor device and process described above.

The elements and acts of the various embodiments described above can be combined to provide further embodiments. These and other changes can be made to the semiconductor device and process in light of the above detailed description.

What is claimed is:

1. A method for making a semiconductor device, comprising:

forming a lead frame structure that includes a plurality of conductive mounting platforms;

mounting a first surface of one of a plurality of die to each of the plurality of conductive mounting platforms;

forming a clip structure that is distinct from the lead frame structure, and that includes a plurality of conductive clips, wherein a first end of each conductive clip is fixed and connected to the clip structure, and a second end of each conductive clip is free;

placing the lead frame structure with the plurality of die in proximity to the clip structure so as to attach each second end of each of the conductive clips to a second surface of one of the plurality of die, the first end of each conductive clip being oriented approximately 180 degrees from the conductive mounting platform of the lead frame with respect to the first and second surfaces of the device, the conductive clip conductively coupling the second surface of the die to the lead conductive mounting platform of the lead frame;

encapsulating each die to form a plurality of semiconductor devices on the lead frame; and separating each semiconductor device from the lead frame structure and the clip structure.

2. The method of claim 1, wherein aligning includes using a fiducial hole to align the clip structure and the lead frame structure.

3. The method of claim 1, further comprising applying a conductive adhesive material to at least one of each conductive mounting platform and the first surface of each die.

4. The method of claim 1, further comprising applying a conductive adhesive material to at least one of each conductive clip and the second surface of each die.

5. The method of claim 1, wherein mounting the first surface of a die to a conductive mounting platform includes applying a conductive adhesive material to the conductive mounting platform and mounting a conductive portion of the first surface of the die to the conductive adhesive material.

6. The method of claim 1, wherein mounting the clip structure to the lead frame structure includes applying a conductive adhesive material to a conductive portion of a second surface of the die and mounting a corresponding conductive clip to the conductive adhesive material.

7. The method of claim 1, further comprising forming a packaging enclosure around at least one portion of a semiconductor assembly formed by each conductive mounting platform, each die, and each conductive clip.

8. The method of claim 1, wherein the semiconductor device is a surface-mount discrete power device.

9. A method for making a semiconductor device, comprising:

mounting a first surface of each of a plurality of die to each of a plurality of conductive mounting platforms of a lead frame structure;

aligning a clip structure that is distinct from the lead frame structure to the lead frame structure, the clip structure including a plurality of conductive clips, wherein a first end of each conductive clip is fixed and connected to the clip structure, and a second end of each conductive clip is free, and wherein aligning includes using at least one reference structure to align the plurality of conductive clips to corresponding die such that the free, second ends of the each conductive clip are positioned over a second surface of each of the plurality of die, the first end of each conductive clip being oriented approximately 180 degrees from the conductive mounting platform of the lead frame with respect to the first and second surfaces of the device;

mounting the clip structure to the lead frame structure, wherein the mounting comprises placing the lead frame structure with the plurality of die in proximity to the clip structure so as to form an electrically conductive path between each die and the second, free end of the conductive clip and a conductive mounting platform of the lead frame structure to which each die is mounted;

encapsulating each die to form a plurality of semiconductor devices on the lead frame; and separating each of the semiconductor devices from the lead frame and the clip structure, including disconnecting each conductive clip from the clip structure and disconnecting each conductive mounting platform from the lead frame structure.

10. The method of claim 9, wherein the reference structure includes a fiducial hole in at least one of the clip structure and the lead frame structure.

11. The method of claim 9, further comprising applying a conductive adhesive material to at least one of each conductive mounting platform, the first surface of each die, and a second surface of each die.

12. The method of claim 9, wherein mounting the clip structure to the lead frame structure includes applying a conductive adhesive material to a conductive portion of a second surface of the die and mounting a corresponding conductive clip to the conductive adhesive material.

13. The method of claim 9, further comprising forming an enclosure around each semiconductor assembly including each conductive mounting platform, each die, and each conductive clip.

* * * * *